United States Patent [19]

Kasprzyk et al.

[11] Patent Number: 4,559,244

[45] Date of Patent: Dec. 17, 1985

[54] COMPOSITE REFRACTORY FOAMS

[75] Inventors: Martin R. Kasprzyk, Ransomville; Monika O. TenEyck, Lewiston, both of N.Y.

[73] Assignee: Kennecott Corporation, Cleveland, Ohio

[21] Appl. No.: 672,864

[22] Filed: Nov. 19, 1984

Related U.S. Application Data

[63] Continuation of Ser. No. 584,198, Feb. 27, 1984, abandoned, and a continuation of Ser. No. 502,285, Jun. 8, 1983, abandoned.

[51] Int. Cl.$^4$ ............................................. D03D 3/00
[52] U.S. Cl. ................................... 427/227; 106/122; 264/44; 427/244; 427/373; 428/688; 428/697; 428/699; 501/82; 521/55; 521/77
[58] Field of Search ................ 521/55, 77; 264/44; 523/179; 501/82; 428/688, 697, 699; 427/227, 427/244, 373; 106/122

[56] References Cited

U.S. PATENT DOCUMENTS

| | | | |
|---|---|---|---|
| 3,090,094 | 5/1963 | Schwartzwalder et al. | 264/44 |
| 3,097,930 | 7/1963 | Holland | 264/44 |
| 3,175,918 | 3/1965 | McGhan et al. | 106/41 |
| 3,345,440 | 10/1967 | Googin et al. | 264/29 |
| 3,353,994 | 11/1967 | Welsh et al. | 521/55 |
| 3,833,386 | 10/1974 | Wood et al. | 264/44 |
| 3,845,181 | 10/1974 | Ravault | 264/44 |
| 3,907,579 | 9/1975 | Ravault | 264/44 |
| 4,004,933 | 1/1977 | Ravault | 264/44 |
| 4,075,303 | 2/1978 | Yarwood et al. | 264/44 |

FOREIGN PATENT DOCUMENTS 67627 12/1982 European Pat. Off. .

*Primary Examiner*—Lorenzo B. Hayes
*Attorney, Agent, or Firm*—David M. Ronyak

[57] ABSTRACT

Non-oxide refractory foams, possessing controlled permeability and uniformity, are prepared by impregnating an organic polymer foam material with a fluid, particulate slurry of a first refractory material, drying, applying to the dried, impregnated material a second refractory material which has a lower melting point than the first refractory material and thereafter heating, at a temperature sufficient to cause melt infiltration of the second refractory material into the impregnated material, thus producing inert and dimensionally stable composite refractory foams having broad utility as particulate filters or carriers.

32 Claims, No Drawings

COMPOSITE REFRACTORY FOAMS

This is a continuation of application Ser. No. 584,198, filed Feb. 27, 1984, now abandoned, and of application Ser. No. 502,285, filed June 8, 1983, now abandoned.

FIELD OF THE INVENTION

The present invention relates generally to porous, relatively inert, and dimensionally stable, composite refractory foams which can be utilized for multiple functions including filtration, catalyst carriers and dopant carriers.

BACKGROUND OF THE INVENTION

There is a continuing need for porous relatively inert and dimensionally stable materials which can be easily formed into suitable structures for a myriad of utilities. Such materials can be used for filtration purposes, particularly in high temperature or corrosive atmospheres, for the filtration of molten metals such as aluminum or copper, as host substrates for catalysts or reactants in a chemical process, as host substrates for dopants or a diversity of other utilities. Typically, it is appropriate to form the material into a specific convenient size or shape and the ease with which the material can be so formed is an important factor to the commercial acceptability of such material.

One method of obtaining porous ceramic materials has been disclosed in the prior art, as represented by Schwartzwalder et al. U.S. Pat. No. 3,090,094 and Holland U.S. Pat. No. 3,097,930 wherein porous ceramic articles are prepared by immersing an open-celled porous element of pliable synthetic or natural organic material in a slurry of finely divided ceramic powder and ceramic binder, removing the excess slurry from the element and firing the material to burn away the synthetic or organic material while vitrifying the ceramic material. Amongst the various materials listed by Holland are carbides. The successful use of materials prepared in the aforesaid manner in technically exacting functions such as the filtration of molten metals, as catalyst host substrates or as dopant host substrates requires that the material possess particular physical and chemical properties such as superior permeability, structural uniformity, strength and relative inertness to chemical attack.

In the attainment of particular physical and chemical properties the prior art has taken various directions. Wood et al. U.S. Pat. No. 3,833,386 McGaham et al. U.S. Pat. No. 3,175,918 and Googin et al. U.S. Pat. No. 3,345,440 seek to attain superior porous materials by admixing aqueous slurry of particulate ceramic material with polymer reactants and in-situ forming a foamed polymeric/ceramic material. Thereafter, the polymeric/ceramic material is cured and subsequently heated to high temperatures to destroy the polymer, leaving a formed refractory material. Example III of the Googin et al. reference discloses the preparation of a silicon carbide foam by admixing a slurry of silicon with polymer reactants to in-situ produce a foamed polyurethane/silicon material, heating to decompose the polyurethane and thereafter firing to 2200° C. to react the carbon with the silicon to form in-situ silicon carbide. McGaham et al. admixes silicon carbide grit with a resin binder and pore forming material to in-situ form a foamed mix which is cured and heated to carbonize the resin. Provision is also made for the addition of silicon to react with the carbonized resin to form a silicon carbide body. Though the aforesaid in-situ processes have some commercial utility, the methods require an extensive array of apparatus, with the particulate matter significantly complicating mixing and the achievement of uniform porosity.

Other prior art has taken the general direction of first forming a porous body of organic foam material, e.g. such as polyethylene, polyester etc., then impregnating with a slurry of finely divided ceramic material, usually in aqueous suspension, then drying and firing the so obtained structure to decompose the organic foam and create a ceramic structure. Ravault U.S. Pat. Nos. 3,845,181, 3,907,579 and 4,004,933 describe typical procedures utilized in the treatment of various organic foams with aqueous ceramic powder containing suspensions. Therein, treated and untreated foam is impregnated with a slurry of ceramic material which is thereafter dried and fired to form the final porous ceramic article. Yarwood U.S. Pat. No. 4,075,303 improves on the process by utilizing a combined rolling/impregnation step to assure an appropriate final structure.

OBJECTS OF THE INVENTION

One object of the invention is to provide a novel porous, relatively inert and dimensionally stable composite refractory foam.

Another object is to provide methods for the preparation of porous refractory foam composites. These and other objects will become apparent from the following description of the invention.

DESCRIPTION OF THE INVENTION

It has been discovered that porous, relatively inert and dimensionally stable composite foamed materials, having a superior pore structure can be produced by a process which comprises impregnating an organic polymer foam material with a slurry containing a first refractory material, drying, coating the dried, impregnated material with a second refractory material which has a lower melting point than the first material and thereafter heating the impregnated and coated material to a temperature sufficient to melt the second refractory material causing infiltration thereof and forming a porous composite refractory foam body. The composite refractory foam thus formed, comprises a first particulated refractory material cellularly arranged in the physical configuration of the organic foam, having a second refractory material infiltrated therethrough and in rigid support thereof.

In accord with the process of the instant invention any suitable organic polymer foam material can be utilized providing it has sufficient physical properties to withstand, as desired, the process treatments prior to high temperature heating. Typical organic polymers which can be utilized in this process include cellulosics, polystyrenes, polyethylenes, polypropylenes, polyvinyl chlorides, latexes, acrylics, polyurethane foamed materials, mixtures thereof and the like. The foam may have varying degrees of rigidity or flexibility at varying temperatures. Impregnation, drying and coating with the infiltration refractory material should be instituted at controlled temperature ranges which insure that undesired breakage, dissociation or degradation of the foam will not occur during early processing steps. A foam which has adequate flexibility at temperature ranges from about 10° C. to about 100° C. is preferred.

The organic foam can be formed in any convenient size and shape, but generally it is formed in substantially the same size and shape as the final product which is sought to be produced. It should be recognized that before and/or during subsequent processing, the foam will be variably compressed, dried, swelled, etc., depending upon the various choice of processing alternatives hereinafter disclosed and consideration should be given thereto when sizing of the foam body for a particular purpose. One advantage of the instant invention is that the organic foam can be formed into rods, billets, etc., which thereafter can be cut into wafers, disks, etc., rather than processing each wafer, disk, etc., individually.

Typically, organic foam materials are available in a wide range of cell sizes from tightly packed small cellular configurations to large cellular configurations. Similarly, the cell density can vary greatly and typically are commercially available in multiple density gradients. We have found that for most utilities cell sizes in the range of about 2500 microns to about 50 microns having about 10 to about 500 pores per linear inch, have produced preferable results. In some instances, it has been found appropriate to compress and heat set the foam material to achieve more desirable porosity and closer size control.

To enable highly efficient production in the semiconductor industry, it is desired to use diffusion sources which are planar and thin, e.g. about 0.040±0.002 inch thickness. Commercially available organic polymeric foams are not at this time available in the desired thickness. Typically the thinnest commercially available organic polymeric foam which meets all of the requisite criteria is about one-eighth inch thickness. Attempts at slicing thick foam parts to the desired gauge have not been successful. Considerable non-uniformity in thickness normally results.

In response to this problem applicants have found that organic polymeric foam meeting all the requisite criteria as well as the desired low thickness and variation in thickness can be obtained as follows. A commercially availabe 100 pores per lineal inch, one-eighth inch thickness reticulated polyurethane foam sheet is compressed between two heated flat platens. One or more shims are placed between the platens to assure that the platens remain parallel and do not come closer together than the desired predetermined amount. The platens are heated to about 350°–450° F. The organic foam is held in compression between the heated platens for about 2 to about 5 minutes during which time the organic foam takes a permanent compression set. The press is thereafter opened and the compressed-and-heat-set organic foam sheet is removed and allowed to cool. The organic foam sheet springs back somewhat upon removal from the press. Thus, the compressed gauge of the foam which corresponds to the thickness of the shims is less than the thickness of the heat set organic foam. To produce an organic foam of about 0.042±0.002 inch thickness, one-eighth inch thick 100 pores per lineal inch polyurethane foam is compressed and heat set at 0.040 inch platen spacing. The amount of springback and the necessary shim thickness is determined empirically.

The resulting compression set organic foam sheet contains in the direction of its planar surfaces the same number of pores per lineal inch as it had orginally. Because it has been reduced in thickness, the number of pores per lineal inch in the direction of thickness has been increased inversely. For the one-eighth inch thickness, 100 pores per lineal inch original foam, the resulting 0.042 inch thick product has about 270 pores per lineal inch.

The compression set organic foam is then treated as described infrax and subsequently cut into discs of three to four inches diameter utilizing a stainless steel cutting die. The second or infiltrating refractory described infra may be applied to the particulate ceramic impregnated organic foam before die cutting into discs but is preferably applied to the discs to conserve the infiltrating refractory.

The specific times and temperatures needed to effect compression setting of a given organic polymeric foam may be determined empirically for those foams which are capable of being compression heat set.

The foam may be treated with various additives prior to, during, or after the impregnation, drying or infiltrant application processes. Typically, such additives may affect the uniform distribution of either particulate refractory material or enhance adherency to the foam material, by swelling or dissolving portions of the foamed structure to create better adhesion, or allow improved infiltration of the second refractory material. In many instances the polymer may be pre-swelled prior to treatment with the fluid slurry to increase the rate and extent of imbibition. Water itself is a suitable swelling agent for cellulosic type polymers, and in other instances aromatic alcohols, ketones or similar suitable solvents may be appropriate.

During the impregnation step of the process, particulate refractory material is deposited on the cellular organic foam, adhering to the structural elements thereof in such manner as to closely approximate the physical configuration of the foam. Upon drying, the organic foam may appear unchanged except for color and its fragile rigidity, but upon closer inspection a thin coat of particulate refractory material can be seen deposited upon the surfaces of the cellular foam.

Typically, the refractory material containing slurry utilized for impregnation is an aqueous suspension containing from about 20 to about 80 parts by weight refractory material, generally having an average particle size of less than about 120 microns. The weight ratio of refractory material impregnated to the weight of dry foam material varies with the density of the refractory, but is generally between about 2:1 to about 12:1. Other compounds may be present such as gell formers, thickening agents or binding agents which may enhance the uniformity of distribution of the material on the foamed polymer structure during impregnation, or its infiltration, or effect its adherency thereto. Other additives may also be present such as agents which affect or in some way control drying, or agents which may have an effect upon subsequent high temperature heating of the refractory materials.

Impregnation of the foamed polymer substance can be affected by several methods. Generally, the amount of refractory deposited on the cellular structure of the polymer foam is in direct proportion to its concentration in any solution/suspension that is used for treatment. Typically, the easiest method is to immerse the polymer foam substance in a concentrated suspension of the material to be deposited. Other means of impregnation, however, include spraying means, roll coating means, or similar methods where the polymer structure is not undesirably harmed during the process. In such systems it is preferred to utilize the refractory in aqueous suspension and various additives may be present which may effect the deposition process.

Impregnation generally occurs at room temperature but the temperature thereof may be varied widely, with generally the only limitations being the deleterious effects on the organic foam being penetrated and/or fluid impregnating refractory slurry.

To improve impregnation of the foam with the fluid suspension, the impregnated foam material is typically treated to maximize the impregnation and deposition of the refractory material while expelling excess fluid suspension therefrom. Generally, this removal of fluid suspension is closely controlled and uniformly controlled throughout the foam workpiece to obtain a uniform refractory article. A wide variety of methods are known in the removal of fluid suspension from the impregnated foam, including blowing out with compressed air, centrifuging and squeezing, including passage between rollers or the like. Generally it has been found that hand squeezing is adequate, however, passing through varying roller pressures can provide a more uniform product.

After impregnation the treated organic material is dried to remove excess fluid. Drying can be achieved by any convenient means such as oven, blower, air drying, etc. Appropriate safety precautions should, however, be taken when the fluid portion of the slurry is an organic compound or contains organic compounds or the like. Generally drying temperatures should be kept low enough so that the organic foam is not detrimentally deformed or otherwise detrimentally harmed thereby. Generally, drying temperatures between from about 100° C. to about 120° C. are preferred for water-based suspensions. It should be noted, however, that higher temperatures might in certain instances be desirable for instance to create a desirable deformation of the organic foam or to achieve a particular configuration or effect. The amount of fluid removed during the drying process can vary widely. Generally, it is preferred to dry to a fluid content less than about 50% by weight of the impregnated material.

Application of the infiltrating refractory (infiltrant) to the dried, impregnated foam can be by a fluid slurry system but generally it is preferred to apply a coarse, dry particulate coating of the infiltrating refractory to the impregnated foam. Typically it is sufficient to coat the surface of the foam with the infiltrant. Generally the weight ratio of infiltrating refractory to the dried impregnated foam is from about 0.05:1 to about 3:1. Particulate material, having a particle size in excess of about 20 microns, is preferred when utilizing easily oxidizable infiltrating materials as it appears to inhibit the influence of an undesirable oxide phase during the infiltration process. The thus infiltrant coated, impregnated foam body is heated to a temperature sufficient to melt the infiltrating refractory but less than that amount needed to melt the impregnated refractory. Upon heating, the organic polymer decomposes, the infiltrating refractory melts, and it is believed that through its wetting action on the impregnated refractory, the melted infiltrating refractory flows into the pores of the impregnating refractory material and the voids left by the decomposed polymer, and, when solidified, forms a matrix comprising a continuous composite with the impregnated phase.

The refractory materials utilized for impregnation and infiltration can be selected from a host of non-oxide materials, though it is generally preferred that the impregnation material have a melting point which exceeds about 1400° C. and the infiltration material has a melting point which exceeds about 1200° C. and is below about 2300° C. The impregnating refractory material selected must have a melting point which is higher than that of the selected infiltrating material.

In addition, the melted (liquid) infiltrating refractory material should have the ability to wet the impregnating refractory material (solid) to a contact angle of less than about 45°. The contact angle is the angle between the solid surface of the impregnating material and the tangent to the liquid surface of the melted infiltrating material at the contact point of the two surfaces. In addition to the ability to wet, there should be resistance between the two materials being utilized to solubility of one into the other.

In the process of the invention, heat is applied to the refractory impregnated, refractory infiltrant coated, organic to a temperature and time sufficient to decompose the organic foam and melt the infiltrating refractory material but less than that which will melt the impregnating refractory. The resulting rigid composite structure has substantially the same physical configuration as the foamed organic polymer, but is comprised of a composite of impregnated and infiltrated refractory materials. Varying pressures may be utilized in any step of the process, but generally it is preferred to operate at atmospheric pressure or less.

Typical refractory materials, operable as impregnating materials in accord with the instant invention, include pure elements such as tungsten, tantalum, molybdenum, niobium, chromium, zirconium, vanadium, titanium, boron, carbon, and the like; binary metal alloys such as tungsten/tantalum, tungsten/ niobium, tungsten/molybdenum, tungsten/chromium, molybdenum/ chromium, molybdenum/titanium, molybdenum/zirconium, and the like; borides such as $AlB_{12}$, $Ti_2B$, $TiB_2$, $ZrB_2$, $ZrB_{12}$, $HfB_2$, $Nb_3B_2$, $NbB$, $Nb_3B_4$, $NbB_2$, $Ta_2B$, $TaB$, $TaB_4$, $TaB_2$, $Cr_2B$, $Cr_5B_3$, $CrB$, $Cr_3B_4$, $CrB_2$, $CrB_4$, $Mo_2B$, $Mo_3B_2$, $MoB$, $MoB_2$, $MoB_5$, $MoB_{12}$, $W_2B$, $WB$, $W_2B_5$, $WB_{12}$, $Mn_4B$, $Mn_2B$, $MnB$, $Mn_3B_4$, $MnB_2$, $MnB_4$, $Ni_4B_3$, $NiB$, and the like; carbides such as $NbC$, $Nb_2C$, $TiC$, $ZnC$, $HfC$, $V_2C$, $VC$, $Ta_2C$, $TaC$, $Cr_{23}C_6$, $Cr_7C_3$, $Cr_3C_2$, $Mo_2C$, $MoC$, $W_2C$, $WC$, $Fe_3C$, $B_4C$, $B_{13}C_2$, $SiC$, and the like; nitrides such as $TiN$, $HfN$, $VN$, $NbN$, $TaN$, $AlN$, $BN$ and the like; phosphides such as $NbP$, $Ti_3P$, $Ti_2P$, $Cr_3P$, $BP$, $CoP_2$, and the like; silicides such as $Ti_5Si_3$, $Ti_5Si_4$, $TiSi$, $TiSi_2$, $Zr_4Si$, $Zr_2Si$, $Zr_5Si_3$, $Zr_4Si_3$, $Zr_6Si_5$, $ZrSi$, $ZrSi_2$, $Hf_2Si$, $Hf_5Si_3$, $Hf_3Si_3$, $HfSi$, $HfSi_2$, $V_3Si$, $V_5Si_3$, $V_5Si_4$, $VSi_2$, $Nb_4Si$, $Nb_5Si_3$, $NbSi_2$, $Ta_9Si_2$, $Ta_2Si_3$, $Ta_5Si$, $TaSi_2$, and the like; ternary transition metals, systems containing carbon, boron, silicon, nitrogen or combinations thereof such as Ti-Zr-C, Ti-Hf-C, Ti-V-C, Ti-Nb-C, Ti-Ta-C, Ti-Mo-B, Zr-Hf-B, Zr-Ta-B, Hf-Ta-B, V-Nb-B, Nb-Ta-Si, Nb-Mo-Si, Nb-W-Si, Tn-Mo-Si, Ta-W-Si, and the like.

Generally any of the aforedescribed impregnating materials, having melting points within the range of about 1200° C. to about 2700° C., can also be utilized as infiltrating materials providing they are used in combination with an impregnating material having a higher melting point. In addition to the aforesaid, however, the infiltrating material can be a compound, mixture or pure element of silicon, cobalt, manganese, nickel and the like.

The following examples are provided to illustrate the invention and are not meant as a limitation thereof. All temperatures are in degrees centigrade unless otherwise indicated.

EXAMPLE 1

Reticulated polyurethane filter foam material having about 20 pores per lineal inch was impregnated with a 70% aqueous alpha SiC slip having a refractory content comprising 16% submicron SiC, 24% 1000 grit SiC and 60% 240 grit SiC. The impregnation was effected by dipping the polyurethane foam into the aqueous composition and removing excess fluids by hand squeezing. The thus impregnated material was allowed to dry overnight at room temperature until it had less than about 10% moisture content.

The top surface of the thus impregnated and dried foam material was coated with dry, powdered (500 micron), silicon to a weight ratio of silicon to impregnated foam material of 0.75:1.00. The coated, impregnated foam was decomposed and silicon infiltrated by heating, in a vacuum furnace, at 1550° C. for 15 minutes. The cooled resulting product comprised a composite of particulate SiC in a matrix of silicon, substantially corresponding in porosity and form to the reticulated polyurethane foam.

EXAMPLE 2

Reticulated polyurethane filter foam was impregnated with alpha SiC slip and air dried in accord with Example 1. The top surface of the resulting dried material was coated with dry, powdered (100 micron) $MoSi_2$ to a weight ratio of $MoSi_2$ to impregnated material of 0.75:1.00. The thus coated, impregnated foam was decomposed and $MoSi_2$ infiltrated by heating at 2200° C., in an argon atmosphere, for 30 minutes. The cooled resulting product comprised a composite of particulate SiC in a matrix of $MoSi_2$, substantially corresponding in porosity and form to the reticulated polyurethane foam.

EXAMPLE 3

Reticulated polyurethane filter foam having a porosity of about 100 pores per inch is impregnated with a 40% aqueous suspension of 1000 grit particulate graphite and air dried in accord with the process of Example 1.

The top surface of the thus impregnated and dried foam material is coated with dry, powdered (500 micron) metallic silicon to a weight ratio of silicon to impregnated material of 2.50:1.00. The coated, impregnated foam is decomposed and silicon infiltrated by heating, in vacuum furnace, at 1525° C. for 15 minutes. The resulting product comprises a composite of a continuous SiC phase and minor discontinuous silicon phase, substantially corresponding in porosity and form to the reticulated polyurethane foam.

EXAMPLE 4

Reticulated polyurethane filter foam having a porosity of about 100 pores per inch is impregnated with a 70% aqueous suspension of 1000 grit $B_4C$ powder, dried, coated with metallic silicon and heated in accord with Example 1.

The resulting product comprises a composite of particulate $B_4C$ in a silicon matrix, substantially corresponding in porosity and form to the reticulated polyurethane foam.

EXAMPLE 5

Reticulated polyurethane foam containing approximately 80 pores per inch is impregnated with a 50% aqueous suspension of 1000 grit particulate graphite, hand squeezed and air dried in accord with Example 1. The foam is coated with plus 100 mesh/minus 60 mesh boron in a weight ratio to impregnated foam of 1.0:1.0. The thus impregnated and coated foam is decomposed and boron infiltrated by heating at 2,400° C. for 30 minutes, in an argon atmosphere.

The resulting product comprises a composite of $B_4C$ and boron, substantially corresponding in porosity and form to the reticulated polyurethane foam.

EXAMPLE 6

Reticulated polyurethane foam containing approximately 60 pores per inch is impregnated with a 50% aqueous suspension of 1000 grit particulate graphite, hand squeezed and air dried in accord with Example 1. The foam is coated with minimum 100 mesh titanium in a weight ratio to impregnated foam of 3.0:1.0. The thus impregnated and coated foam is carbonized and titanium infiltrated by heating at 1850° C., for 30 minutes, in an argon atmosphere.

The resulting product comprises a composite of TiC in a titanium matrix, substantially corresponding in porosity and form to the reticulated polyurethane foam.

EXAMPLE 7

Reticulated polyurethane foam containing approximately 100 pores per inch is impregnated with a 60% aqueous suspension of 1000 grit particulate boron, hand squeezed and air dried in accord with Example 1. The foam is coated with minus 60 mesh metallic silicon in a weight ratio to impregnated foam of 1.0:1.0. The thus impregnated and coated foam is then heated, in a vacuum furnace at 1,650° C. for 30 minutes.

The resulting product comprises a composite of $B_6Si$ in silicon, substantially corresponding in porosity and form to the reticulated polyurethane foam.

We claim:

1. A composite refractory foam devoid of organic polymeric material, comprising a first particulated refractory material, open cellularly and interconnectingly arranged, having a second refractory material having a lower melting temperature than the first refractory material, melt infiltrated between at least a portion of the particles of first particulated material.

2. The composite foam of claim 1 wherein the first and the second refractory materials are non-oxide refractory materials.

3. The composite foam of claim 1 wherein the second refractory material has a melting temperature between 1200° C. and about 2300° C.

4. The composite foam of claim 1 wherein at a temperature where the second refractory material is a liquid and the first refractory material is a solid, the liquid refractory material wets the solid refractory material to a contact angle of less than 45 degrees.

5. Ihe composite foam of claim 1 having a cell size from about 2500 microns to about 50 microns.

6. The composite foam of claim 1 wherein the first particulated refractory is selected from the group consisting of SiC, molybdenum, carbon, boron, $TiB_2$, $MoSi_2$ and $B_4C$.

7. The composite foam of claim 1 wherein the second infiltrating refractory is selected from the group consisting of silicon, boron, titanium and $MoSi_2$.

8. The composite foam of claim 1 wherein said first particulated material is silicon carbide and said second refractory material is silicon.

9. The composite foam of claim 1 wherein said first particulated material is silicon carbide and said second refractory material is $MoSi_2$.

10. The composite foam of claim 1 wherein said first particulate material is selected from particulate graphite or $B_4C$ and said second refractory material is silicon.

11. The composite foam of claim 1 wherein the first particulated refractory material is selected from particulate SiC or $B_4C$ in a matrix of Silicon or $MoSi_2$.

12. A process for the preparation of a composite refractory foam comprising impregnating an organic foam material with a fluid slurry of a first refractory material, drying, applying thereto a second refractory material having a lower melting point than the first refractory material, heating the thus treated foam material for a time and to a temperature sufficient to decompose the organic foam which heating is to at least the melting point of the second refractory material but less than that of the first refractory material and infiltrating said first refractory material with said second refractory material.

13. The process of claim 12, wherein the organic foam is heat compression set to a predetermined thickness prior to impregnation with a slurry of refractory material.

14. The process of claim 12 wherein at a temperature where the second refractory material is a liquid and the first refractory material is a solid, the liquid refractory material wets the solid refractory material to a contact angle of less than about 45 degrees.

15. The process of claim 12 wherein the impregnated organic foam material is treated to expel fluids prior to drying.

16. The process of claim 15 wherein said material is treated to expel fluids by squeezing or rolling.

17. The process of claim 12 wherein said heating is to a temperature from about 1200° C. to about 2300° C.

18. The process of claim 12 wherein the organic foam is compressed prior to impregnation.

19. The process of claim 12 wherein the cell size of the organic foam is from about 2500 microns to about 50 microns.

20. The process of claim 12 wherein the organic foam has from about 10 to about 500 pores per linear inch.

21. The process of claim 12 wherein the fluid slurry is an aqueous slurry.

22. The process of claim 12 wherein said fluid slurry contains from about 10 to about 80 parts by weight refractory material.

23. The process of claim 12 wherein said infiltrating refractory is applied by coating the surface of the dried impregnated foam with a dry particulate refractory material.

24. The process of claim 23 wherein said infiltrating particulate material has an average particle size of about 20 microns or more.

25. The process of claim 12, wherein the impregnating and the infiltrating refractory materials are non-oxide refractory materials.

26. The process of claim 12 wherein the impregnating refractory material is at least one of SiC, $B_4C$, boron, $MoSi_2$, molybdenum, carbon and $TiB_2$.

27. The process of claim 12 wherein the infiltrating refractory material is at least one of silicon, boron, titanium and $MoSi_2$.

28. The process of claim 12 wherein the organic foam is at least one selected from the group consisting of cellulosics, polystyrenes, polyethylenes, polypropylenes, polyvinyl chlorides, latexes, acrylics and polyurethanes.

29. The process of claim 12 wherein the organic foam is polyurethane.

30. The process of claim 12 wherein the organic foam material is a polyurethane foam having a cell size of from about 2500 microns to about 50 microns, the fluid slurry is an aqueous slurry, and the impregnated organic material is treated to expel fluids prior to drying.

31. The product found by the process of claim 12.

32. The product found by the process of claim 30.

* * * * *